United States Patent
Amidi et al.

(10) Patent No.: US 7,509,545 B2
(45) Date of Patent: Mar. 24, 2009

(54) METHOD AND SYSTEM FOR TESTING MEMORY MODULES

(75) Inventors: Mike H. Amidi, Lake Forest, CA (US);
Michael Rubino, San Jose, CA (US);
Larry C. Alchesky, Tracy, CA (US)

(73) Assignee: Smart Modular Technologies, Inc., Hopkinton, MA (US)

( * ) Notice: Subject to any disclaimer, the term of this patent is extended or adjusted under 35 U.S.C. 154(b) by 387 days.

(21) Appl. No.: 11/480,073

(22) Filed: Jun. 29, 2006

(65) Prior Publication Data
US 2008/0022166 A1    Jan. 24, 2008

(51) Int. Cl.
*G11C 29/00*   (2006.01)
(52) U.S. Cl. .............................. 714/718; 714/25; 714/5; 714/719; 714/721; 714/731; 714/744; 714/742; 365/201
(58) Field of Classification Search .................... None
See application file for complete search history.

(56) References Cited

U.S. PATENT DOCUMENTS

| | | | |
|---|---|---|---|
| 7,196,554 B2* | 3/2007 | Taskin et al. | 327/99 |
| 7,259,604 B2* | 8/2007 | Gomm | 327/175 |
| 2003/0035328 A1* | 2/2003 | Hamamatsu et al. | 365/200 |

* cited by examiner

*Primary Examiner*—John P Trimmings
(74) *Attorney, Agent, or Firm*—DLA Piper LLP (US)

(57) ABSTRACT

A method and system for testing memory modules is disclosed. The system includes a memory module and a connector configured to receive the module. The memory module is configured to operate in two modes: In the first operation mode the module uses a frequency between a low frequency and a high frequency. In the second operation mode, the module uses a frequency lower than the lower frequency. A control circuit is coupled to the connector. The control circuit is configured to apply a control signal to the circuit module when the circuit module is received in the connector. When the circuit module is received in the connector, the control signal is applied. This applied control signal causes the module to operate in the second operation mode.

23 Claims, 10 Drawing Sheets

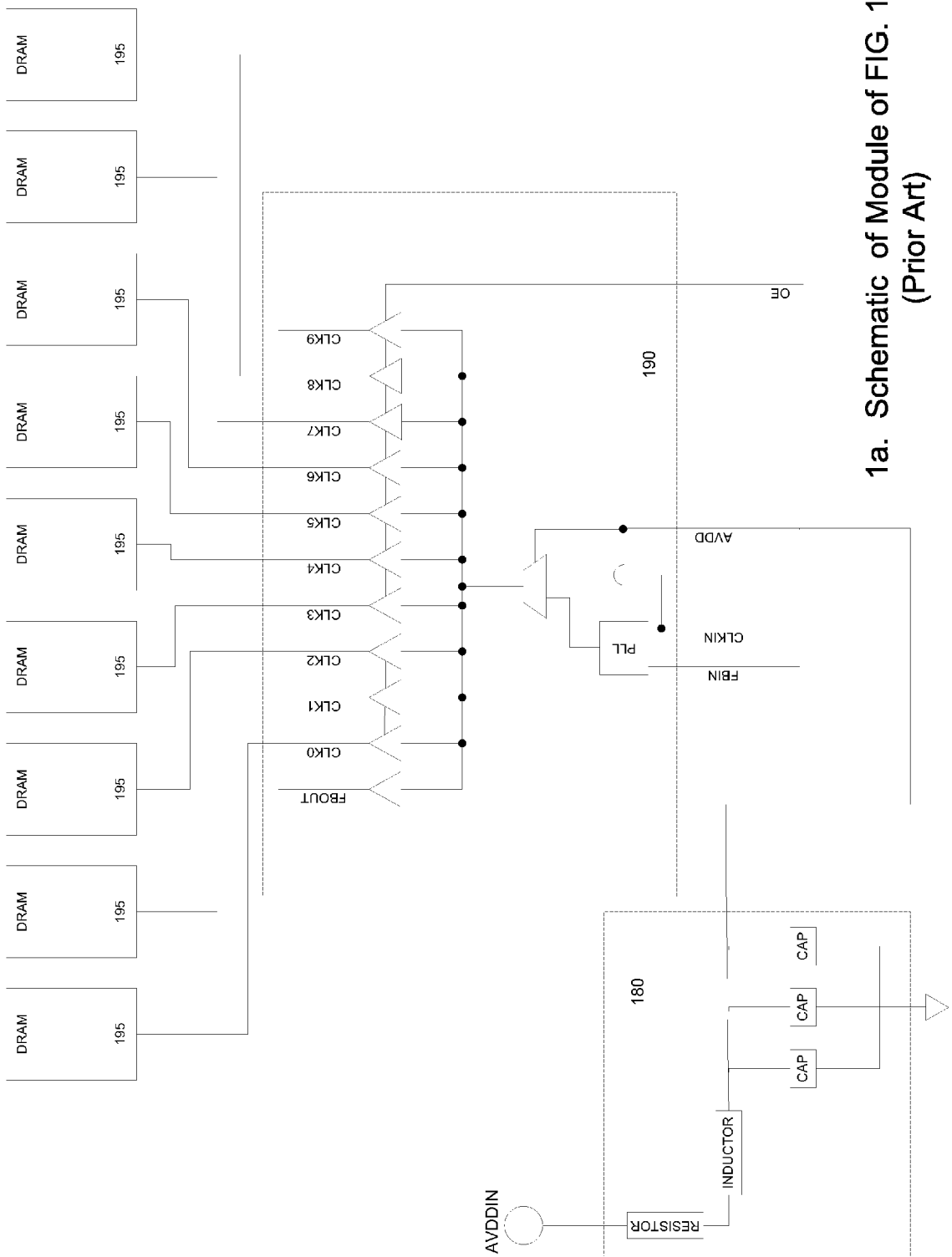
1a. Schematic of Module of FIG. 1 (Prior Art)

System Mother Board Socket Simplified Schematic diagram (Prior Art)

Clock Driver Filtering Circuitry on Normal DIMM
(Prior Art)

FIG. 7  DIMM Being Inserted In Burn-In Board

METHOD AND SYSTEM FOR TESTING MEMORY MODULES

CROSS-REFERENCE(S) TO RELATED APPLICATION(S)

Not Applicable.

STATEMENT AS TO RIGHTS TO INVENTIONS MADE UNDER FEDERALLY SPONSORED RESEARCH OR DEVELOPMENT

Not Applicable.

BACKGROUND OF THE INVENTION

The present invention generally relates to integrated circuit assemblies, and in particular to methods and systems for burn-in screening of integrated circuit assemblies.

Computer systems used for high availability and mission critical applications require highly reliable components and interconnections. Supposedly good components and interconnections can fail prematurely under the stress of normal operation. Removing weak components and interconnections would make systems more reliable. The weaklings can be made to fail by operating them for short periods of time under accelerated conditions—so-called "burn-in." Once they have failed, the weaklings can be detected and removed before the system is put in service.

Systems and components can be burned-in by operating them at temperatures much higher than normal. This can be done in two ways: by increasing the temperature of the surroundings—"ambient temperature," or by increasing the power dissipated in the components. Ambient temperature is increased by placing the components or systems in an oven and then increasing the temperature. Power dissipation for MOS devices can be increased by increasing the clock frequency. Thus, increasing clock frequency raises the temperature of MOS integrated circuits. The complex MOS circuits known as DRAMs (Dynamic Random Access Memories) are routinely burned-in.

Some modules containing DRAMs fail early, even though the DRAMs were burned-in before being assembled into modules. These failures may be caused by defects induced by the module assembly process itself. Thus it would be desirable to perform burn-in on the assembled modules.

One disadvantage of module burn-in is its cost, as the memory module industry is quite cost sensitive. Burn-in can be quite expensive, because each module may have to remain at an elevated temperature in a specialized burn-in system for many hours or even days.

Burn-in cost can be reduced by reducing the cost of the burn-in equipment. Cost can be reduced by increasing the chamber ambient temperature to heat the modules, instead of increasing module power dissipation, because increased power dissipation requires expensive power supplies to provide the necessary current. Power supply cost can be reduced even more by operating the modules at lower-than-normal frequencies—say, 20 MHz. Moreover, the lower the clock frequency being used, the less expensive the test equipment required for clock signal generation, and the less expensive the cabling required for clock signal distribution.

Attempts to significantly lower the operating frequency run into a problem. Referring to FIG. 1, a module 100 contains a clock driver 190 that supplies clock frequency in phase to each DRAM 195 on a module. These clock driver circuits contain phase lock loop circuits (PLLs) that operate over a certain frequency range. PLLs cannot lock at lower frequencies, say, below 40 MHz. Thus, what is desired is a way to operate memory modules at frequencies below the minimum PLL lock frequency.

SUMMARY OF THE INVENTION

In one embodiment, a system for operating a circuit module is disclosed. The system includes a circuit module and a connector configured to receive the module. The circuit module is configured to operate in two modes: In the first operation mode the module uses a frequency between a lower frequency and a higher frequency. In the second operation mode, the module uses a frequency lower than the lower frequency. A control circuit is coupled to the connector. The control circuit is configured to apply a control signal to the circuit module when the circuit module is received in the connector. When the circuit module is received in the connector, the control signal is applied. This applied control signal causes the module to operate in the second operation mode.

In another embodiment, a circuit module is disclosed. The circuit module includes a clock supplying circuit, such as a clock driver, and a control circuit. The clock supplying circuit is configured to cause the circuit module to operate in one of two modes: a first operation mode and a second operation mode. In the first operation mode the clock supplying circuit is configured to cause the circuit module to operate at a frequency between a lower frequency and a a higher frequency. In the second operation mode the clock supplying circuit is configured to cause the circuit module to operate at a frequency lower than the lower frequency. The control circuit generates a clock control signal when the circuit module is received in a connector that applies a control signal to the circuit module. This clock control signal causes the circuit module to operate in the second operation mode.

In another embodiment, a method for burning in a memory module is disclosed. The memory module includes a clock supplying circuit. The clock supplying circuit causes the circuit module to operate at a frequency between a lower frequency and a higher frequency. The method includes two steps: providing a connector for receiving the memory module, and applying a control signal when the memory module is received by the connector. The control signal causes the memory module to operate at a frequency lower than the lower frequency.

The present invention may offer a number of benefits and/or advantages. For example, the present invention lowers the cost of burn-in screening of modules by allowing modules with MOS devices to be operated at low clock frequencies, thus lowering the power required by the modules. Furthermore, by permitting module operation at lower clock frequencies, the present invention enables the use of less expensive clock generators, as well as less expensive cabling required to supply the modules with clock frequencies.

Reference to the remaining portions of the specification, including the drawings and claims, will realize other features and advantages of the present invention. Further features and advantages of the present invention, as well as the structure and operation of various embodiments of the present invention, are described in detail below with respect to accompanying drawings, like reference numbers indicate identical or functionally similar elements.

BRIEF DESCRIPTION OF THE DRAWINGS

Aspects, advantages and novel features of the present invention will become apparent from the following description of the invention presented in conjunction with the accompanying drawings:

FIG. 1a is a simplified schematic diagram of the memory module in FIG. 1.

FIG. 7 depicts one embodiment of the invention;

DETAILED DESCRIPTION OF ILLUSTRATIVE EMBODIMENTS

One or more embodiments of the present invention will now be described.

Figure 1:
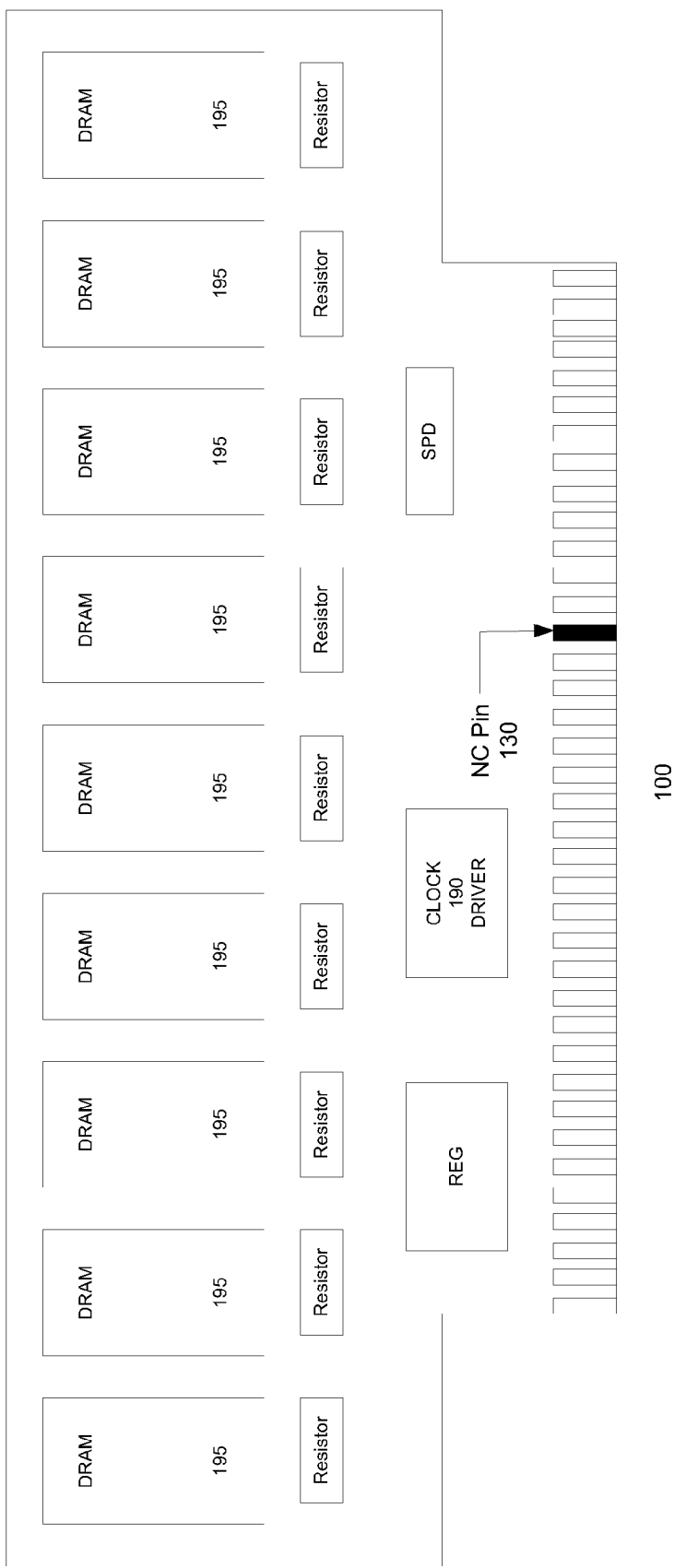
FIG. 1 is a component mounting diagram of an existing memory module.

FIG. 1a is a simplified schematic drawing of the module of FIG. 1. The clock driver 190 supplies clock frequency in phase to each DRAM 195 on the module. Internal to the clock driver 190 is a phase lock loop circuit (PLLs) that operates over a frequency range between a lower frequency and a higher frequency. Although the PLL cannot lock at frequencies below the lower frequency, there is a way to operate memory modules at frequencies below the minimum PLL lock frequency.

The phase lock loop internal to the clock driver 190 is designed to be bypassed by putting the clock driver 190 into buffer mode. Buffer mode allows the incoming clock signal to pass through the clock driver 190 to the DRAMs 195 directly. Then the module can be operated at low clock frequencies. Grounding the Analog $V_{DD}$ input ($AV_{DD}$) of the clock driver 190 puts the clock driver 190 into buffer mode. (Some memory suppliers miscall $V_{DD}$, $V_{CC}$.) Once the clock driver 190 is put in buffer mode, the burn-in system (not shown) can set the clock frequency. For normal operation, however, the Analog $V_{DD}$ input must again be connected to $V_{DD}$. In FIG. 1a, the Analog $V_{DD}$ input of the clock driver is connected to a voltage potential $AV_{DDIN}$ through a filter circuit 180 indicated by dashed lines.

Figure 2:
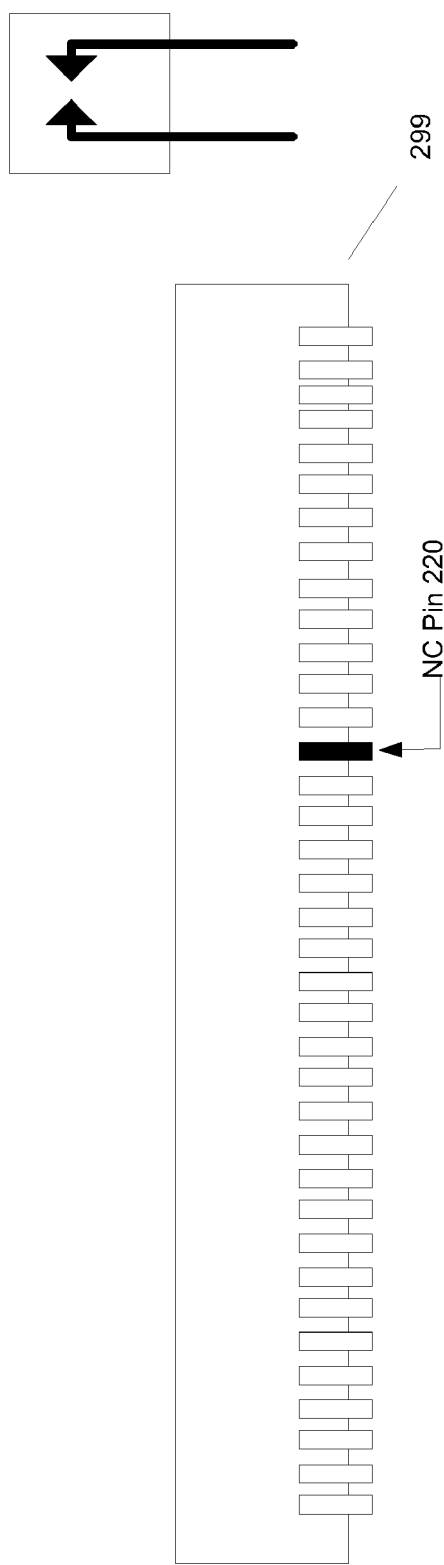
FIG. 2 depicts a memory module connector from a typical use application.
Figure 3:
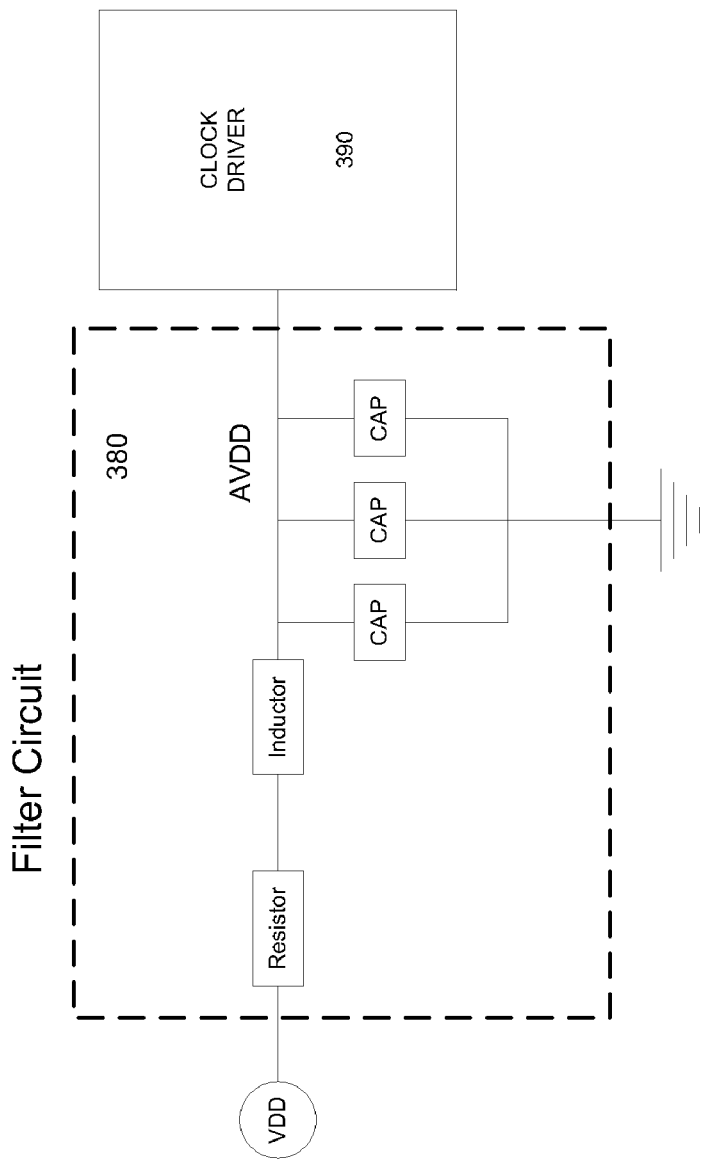
FIG. 3 is a simplified schematic diagram showing the $AV_{DD}$ control input of a clock driver circuit on an existing memory module connects to $V_{DD}$ through a filtering circuit.

It is of note that not every contact pad on the DIMM is required for use with a computer. FIG. 1 depicts a DIMM 100 with a normally not connected DIMM contact pad 130. FIG. 2 depicts a connector 299 with a correspondingly not connected connector contact 220. When the DIMM 100 of FIG. 1 is inserted into the connector 299 of FIG. 2, contact pad 130 will mate with connector contact 220. FIG. 3 depicts a clock driver 390 configured for normal operation by connecting its Analog $V_{DD}$ input ($AV_{DD}$) to $V_{DD}$ via a filter circuit 380.

Figure 4:
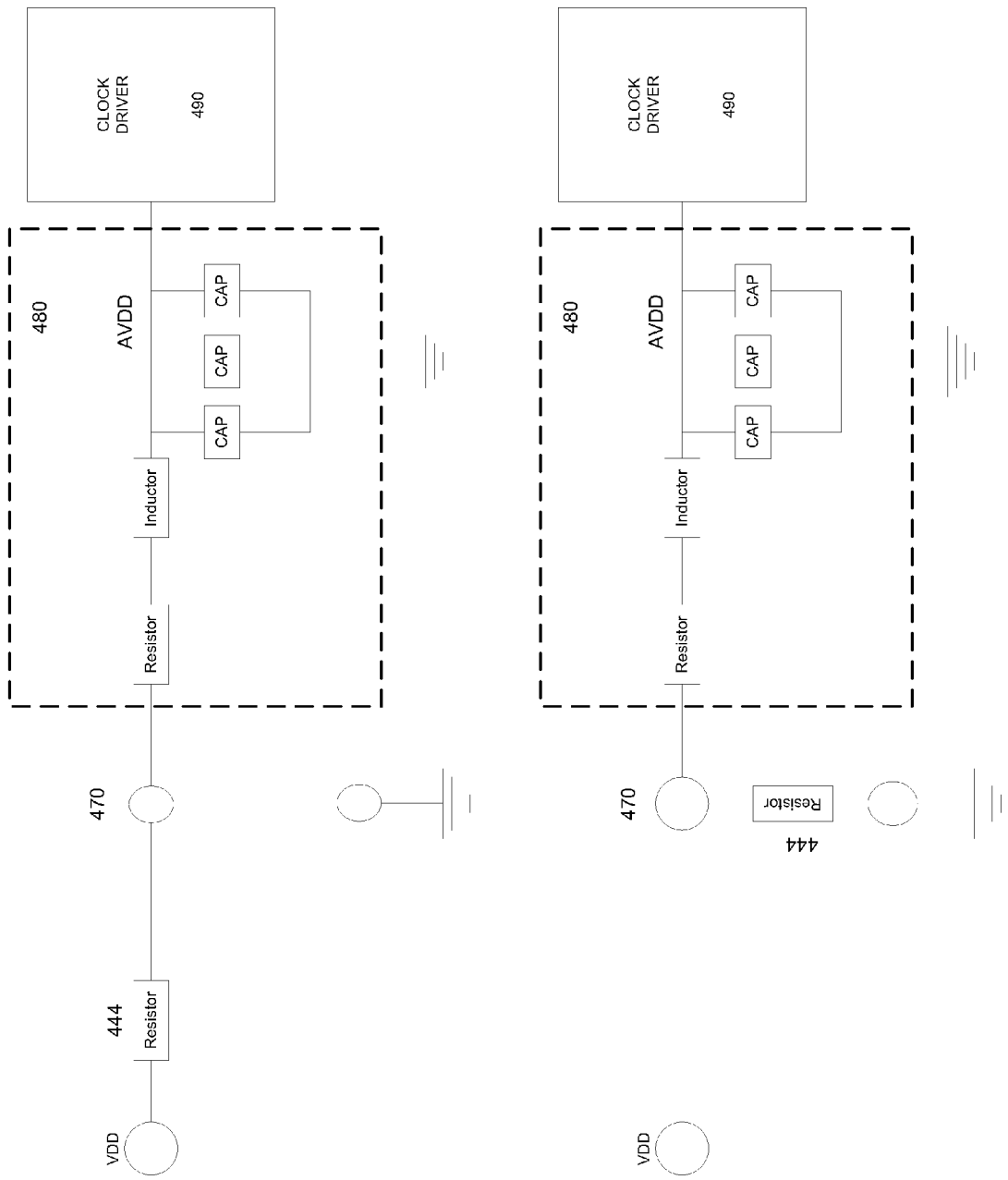
FIG. 4 shows one embodiment of the invention.

One way to connect the $AV_{DDIN}$ to ground, thus bypassing the phase lock loop, would be to physically rework the module before and after burn-in. This could be done by adding a low value resistor to the circuit of FIG. 3. In FIG. 4a, for non-burn-in use, a low value resistor 444 would connect the Analog $V_{DD}$ input ($AV_{DD}$) of the clock circuit 490 to $V_{DD}$ via a filter circuit 480. In FIG. 4b, before burn-in, the resistor 444 is first unsoldered, then soldered between connection point 470 and ground. After burn-in, the resistor 444 must be unsoldered once more, then replaced once more between connection point 470 and $V_{DD}$.

Figure 5:
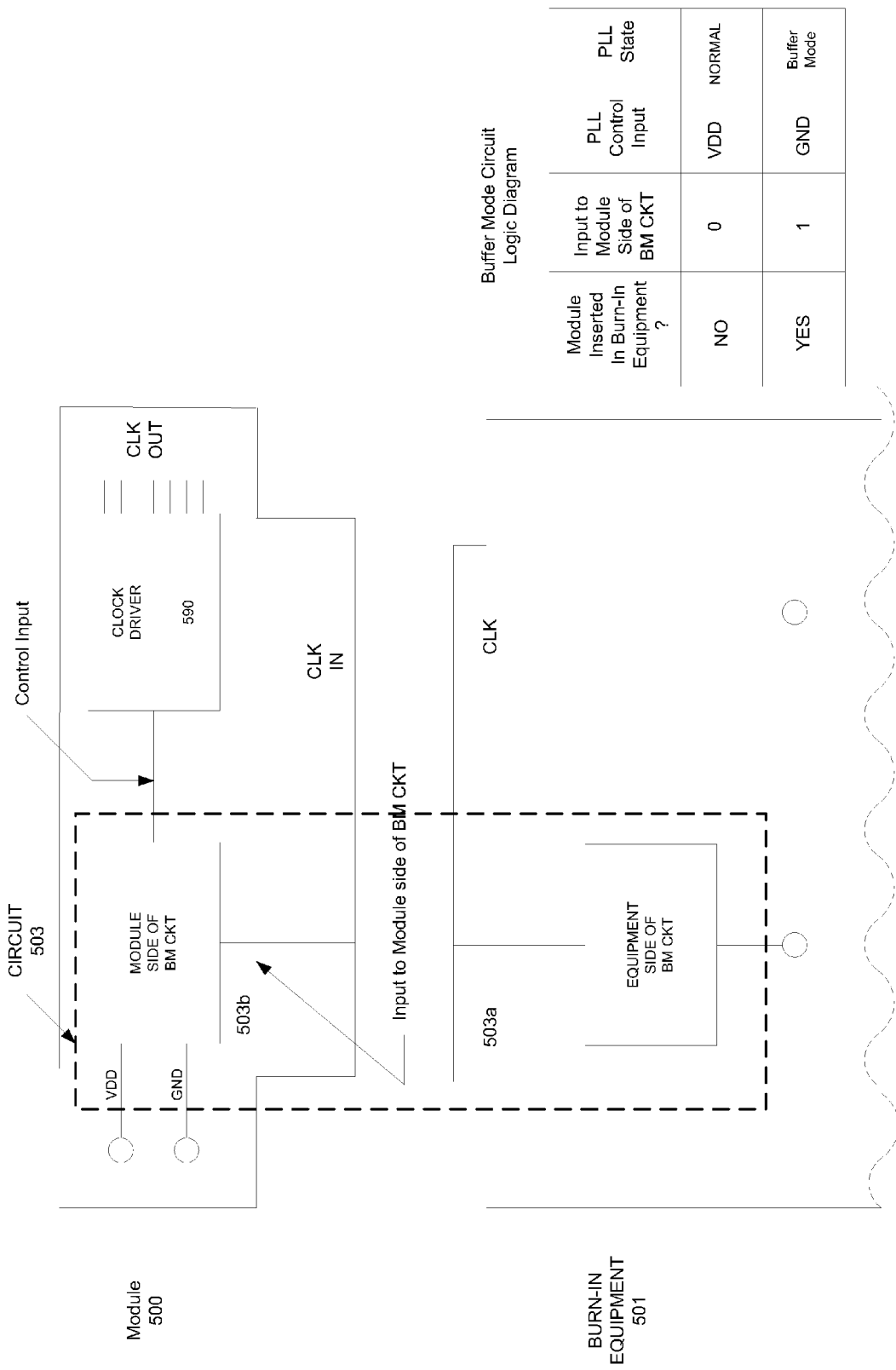
FIG. 5 is a simplified schematic diagram illustrating one embodiment of the present invention.

FIG. 5 shows a block diagram of one embodiment of the present invention, including a module 500, such as a Dual Inline Memory Module, a burn-in equipment 501, a buffer mode circuit 503 divided into an equipment side 503a and a module side 503b, and a clock driver 590. The burn-in equipment 501 stresses the module 500. The equipment side 503a of the circuit 503 applies a potential to the module side 503b of the circuit 503 when the module is inserted. The module side 503b of circuit 503 changes output states depending on the potential applied to it. The clock driver 590 is in phase lock mode if the control input voltage is $V_{DD}$, and in buffer mode if the control input voltage is ground. Thus when the module 500 is inserted into the equipment 501, the equipment side 503a of the circuit 503 applies a potential to the module side 503b of the circuit 503 through mating contacts (omitted for clarity) on the module 500 and the burn-in equipment 501, causing the output of the circuit 503, and thus the voltage applied to the control input of the clock driver 590, to change from $V_{DD}$ to ground. Grounding the control input puts the clock driver 590 into buffer mode, allowing the DIMM 500 to be operated at frequencies lower than the clock driver 590 can achieve phase lock. This low frequency operation reduces power consumption during burn-in.

FIG. 5's logic table summarizes the operation of the buffer mode circuit 503: When the module 500 is not inserted into the burn-in equipment 501, the input to the module side 503b of the buffer mode circuit 503 is at logic low, setting the clock driver's control input at $V_{DD}$, which puts the clock driver 590 into phase lock mode. When the module 500 is inserted into the burn-in equipment 501, the input to the module side 503b of the buffer mode circuit 503 is at logic high, setting the clock driver's control input at ground, which puts the clock driver 590 into buffer mode.

Figure 6A:
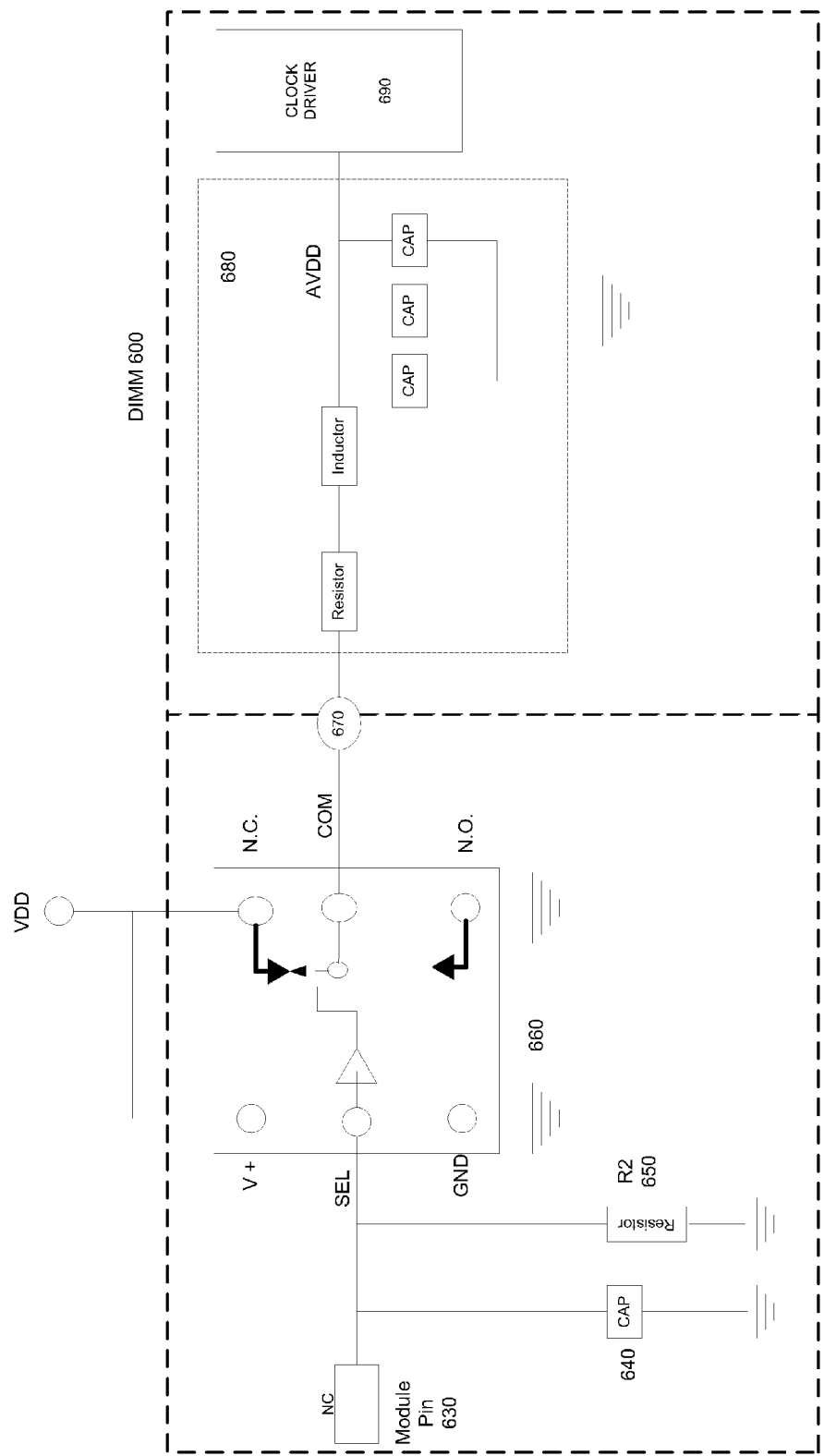
FIGS. 6a and 6b are simplified schematic diagrams illustrating one embodiment of the present invention.
Figure 6B:
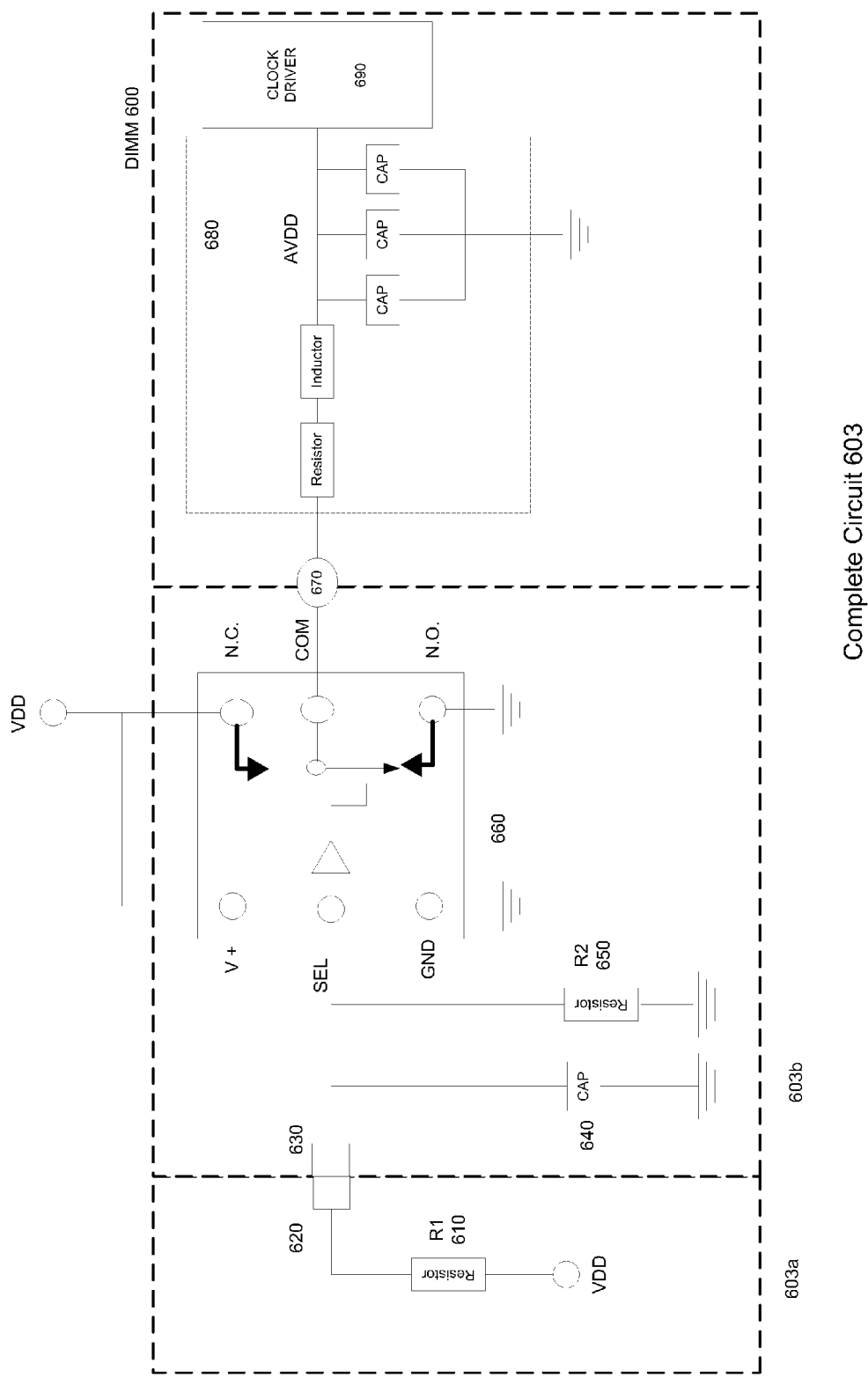

FIG. 6b is a schematic diagram detailing the embodiment depicted in FIG. 5. A circuit 603 is divided into two parts: 603a and 603b, the circuit 603b being mounted on a DIMM 600. The circuit 603a comprises a first resistor 610 and a connector contact 620. The circuit 603b comprises a connector contact 630, a capacitor 640, a resistor 650, and an analog switch 660. The resistor 610 forms a resistor divider with the second resistor 650 when the circuit is completed. The connector contact 620 mates with the connector contact 630. The capacitor delays the ramp-up of the $V_{IHAC}$ on the SEL input of the analog switch 660. The analog switch 660 connects the COM output to one of two potentials, depending on the voltage on the SEL input. When the two parts of the circuit 603 are joined, connector contact 620 mates with connector contact 630, causing current to flow from $V_{DD}$ to ground through the series combination of the first resistor 610 and the second resistor 650. This current flow causes the voltage on the SEL input of analog switch 660 to rise to $$(V_{DD})\frac{R2}{(R1+R2)},$$

where R1 is resistor 610 and R2 is resistor 650. Here, the values of resistors 610 and 650 have been chosen to make $V_{SEL}$ sufficiently high to operate the switch, making the output COM connect to the normally open (N.O.) contact instead of the normally closed (N.C.) contact. When the switch operates, the $AV_{DD}$ input of the clock circuit 690, is connected to ground, because the $AV_{DD}$ input of the clock circuit 690 is connected to the output COM of the analog switch 660 by a connector 670 through the filter network 680, and because the output COM is connected to ground. Grounding the $AV_{DD}$ input puts the clock circuit 690 into buffer mode.

When the DIMM 600 is not being burned in, the two parts of the circuit 603 are not joined as shown in FIG. 6a, and at most only the leakage current of the input of the analog switch flows through the second resistor 650 to ground. This leakage current flow cannot cause the voltage on the SEL input of analog switch 660 to rise high enough to operate the switch. Thus the output COM remains connected to the normally closed (N.C.) contact. Assuming the circuit receives power, the $AV_{DD}$ input of the clock driver 690, is connected to $V_{DD}$ because the $AV_{DD}$ input of the clock driver 690 is connected to the output COM of the analog switch 660 through the filter network 680, and because the output COM is connected to $V_{DD}$.

Figure 8:
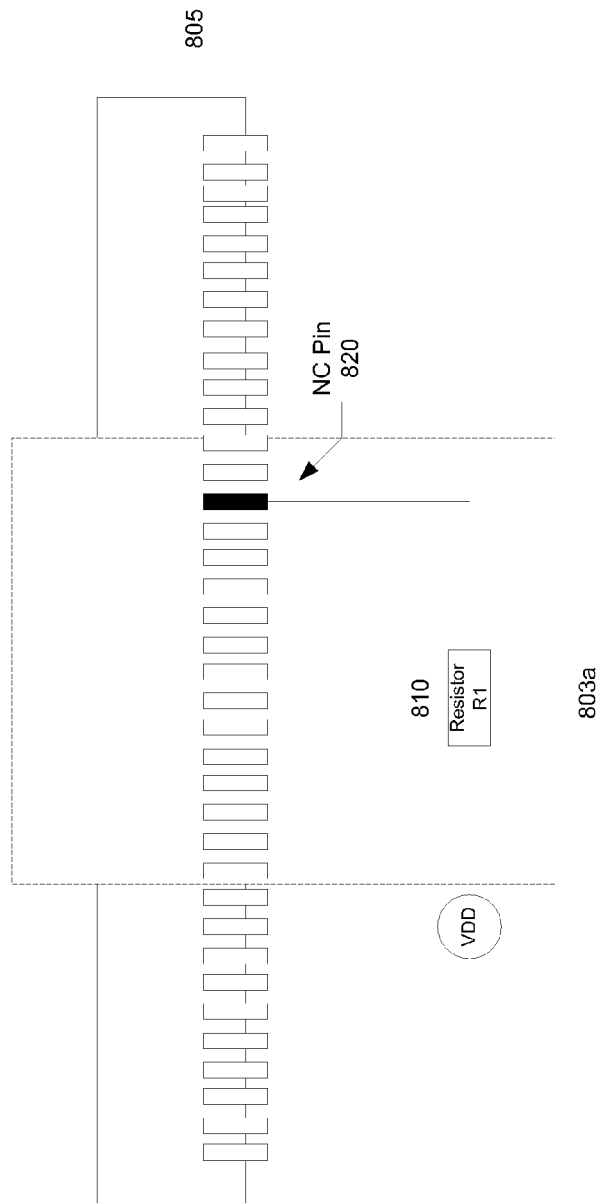
FIG. 8 is a simplified schematic representation of a memory module connector on a burn-in tester mother board, in one embodiment of the invention.

FIG. 7 further illustrates the embodiment of the present invention depicted in FIG. 5 and FIGs. 6a and 6b: A dual inline memory module (DIMM) 700 with DRAMs 795, comprising circuit 703b; and a burn in test system comprising the DIMM 700 and a burn-in board 707. The burn-in board 707 further comprises circuit 703a, a connector 705 containing the connector contact 730 previously described as part of the circuit 603a. FIG. 8 focuses on the connector 805 on the burn-in board, showing the circuit 803a, comprising the resistor 810 and the connector contact 820.

While the present invention is described hereinabove with respect to memory devices, it will be appreciated by one skilled in the art that the present invention may be used or applied to a variety of integrated devices. One skilled in the art will also appreciate that the analog switch function in the present invention can be implemented using electromechanical or other switches, as well as with logic circuits with or without output load buffering. Moreover, while the present invention is described hereinabove with respect to memory modules being inserted into connectors on motherboards, it will be appreciated by one skilled in the art that the present invention may be used or applied to a variety of interconnected modules, boards, and systems.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention not be limited by this detailed description, but by the claims and the equivalents to the claims appended hereto.

What is claimed is:

1. A system for operating a circuit module, comprising:
a connector configured to receive the circuit module;
the circuit module configured to operate in a first operation mode using a frequency between a lower frequency and a higher frequency, and a second operation mode using a frequency lower than the lower frequency; and
a first control circuit, coupled to the connector, configured to apply a control signal to the circuit module when the circuit module is received in the connector;
wherein, responsive to the circuit module being received in the connector, the applied control signal causes the circuit module to operate in the second operation mode.

2. The system of claim 1, wherein the control signal is a voltage or a current.

3. The system of claim 1, wherein: the circuit module comprises a clock supplying circuit and a second control circuit; and
the second control circuit is configured to cause the circuit module to operate at a frequency lower than the lower frequency, in response to the control signal applied by the first control circuit when the circuit module is received in the connector.

4. The system of claim 3, wherein the clock supplying circuit comprises a phase lock loop circuit and a control input.

5. The system of claim 4, wherein the clock supplying circuit is configured to receive a clock signal, pass the clock signal though the phase lock loop circuit, and distribute the clock signal.

6. The system of claim 5, wherein the lower frequency is determined by of the phase lock loop circuit.

7. The system of claim 6, wherein the second control circuit causes the circuit module to operate at a frequency lower than the lower frequency by applying a signal to the control input of the clock supplying circuit, causing said clock supplying circuit to bypass the phase lock loop circuit and distribute the received clock signal directly, in response to the control signal applied by the first control circuit.

8. The system of claim 7 wherein:
the first control circuit comprises an electrical conductor connecting a voltage potential through a first resistor to a contact on the connector; and
the second control circuit comprises:
a contact pad forming electrical contact with said contact on the connector when the circuit module is received in the connector;
a switching circuit having a control input;
an electrical conductor connecting said contact pad to said control input;
a second resistor connecting said control input of the switching circuit to ground, said resistor forming a resistor divider with the first resistor when the circuit module is received in the connector; and
an electrical circuit connecting the output of the switching circuit to a control input of said clock supplying circuit;
whereby the resistor divider so formed causes the voltage at the input of the control input of the switching circuit to change sufficiently to cause the switching circuit to change output states, causing the clock supplying circuit to bypass the phase lock loop and distribute the received clock signal directly.

9. The system of claim 8, wherein the switching circuit comprises a double throw analog switch.

10. The system of claim 9, wherein the two output states of the switching circuit are $V_{DD}$ and ground.

11. The system of claim 10, wherein the electrical circuit connecting the output of the switching circuit to the control input of the phase lock loop comprises a filter network.

12. A circuit module comprising:
a clock supplying circuit configured to cause the circuit module to operate in a first operation mode using a frequency between a lower frequency and a higher frequency, and a second operation mode using a frequency lower than the lower frequency; and
a control circuit configured to generate a clock control signal responsive to a control signal applied to the circuit module when the circuit module is received in a connector,
wherein the clock control signal causes the circuit module to operate in the second operation mode.

13. The module of claim 12, wherein the control signal applied to the circuit module is a voltage.

14. The module of claim 12, wherein the control signal applied to the circuit module is a current.

15. The module of claim 12, wherein the clock supplying circuit comprises a phase lock loop circuit and a control input.

16. The module of claim 15, wherein the clock supplying circuit is configured to receive a clock signal, pass the clock signal though the phase lock loop circuit, and distribute the clock signal.

17. The module of claim 16, wherein the lower frequency is determined by the phase lock loop circuit.

18. The module of claim 16, wherein the control circuit causes the circuit module to operate at a frequency lower than the lower frequency by supplying a signal to the control input of the clock supplying circuit, causing said circuit to bypass the phase lock loop circuit and distribute the received clock signal directly, in response to a control signal applied to the circuit module when the circuit module is received in a connector of a circuit board.

19. The module of claim 18, wherein the control circuit comprises:
    a contact pad, said contact pad configured to form electrical contact with a contact on a connector when the circuit module is received in the connector;
    a switching circuit having a control input;
    an electrical conductor connecting said contact pad to said control input;
    a resistor connecting said control input of the switching circuit to ground; and
    an electrical circuit on the module connecting the output of the switching circuit to the control input of said clock supplying circuit;
    whereby a current applied to the contact pad causes the voltage at the input of the control input of the switching circuit to change sufficiently to cause the switching circuit to change output states, causing the clock supplying circuit to bypass the phase lock loop and distribute the received clock signal directly.

20. The module of claim 19, wherein the switching circuit comprises a double throw analog switch.

21. The module of claim 19, wherein two output states of the switching circuit are $V_{DD}$ and ground.

22. The module of claim 19, wherein the electrical circuit connecting the output of the switching circuit to the control input of the phase lock loop comprises a filter network.

23. A method for burning in a memory module including a clock supplying circuit that causes a circuit module to operate at a frequency between a lower frequency and a higher frequency, the method comprising the steps of:
    providing a connector for receiving the memory module; and
    responsive to the memory module being received by the connector, applying a control signal to cause the memory module to operate at a frequency lower than the lower frequency.

* * * * *